United States Patent [19]

Scheer

[11] 4,453,138

[45] Jun. 5, 1984

[54] BROADBAND INJECTION LOCKED OSCILLATOR SYSTEM

[75] Inventor: Richard Scheer, Jackson Heights, N.Y.

[73] Assignee: ITT Corporation, New York, N.Y.

[21] Appl. No.: 291,211

[22] Filed: Aug. 10, 1981

[51] Int. Cl.³ .............................................. H03L 7/20
[52] U.S. Cl. .......................................... 331/47; 331/2; 331/25; 331/53
[58] Field of Search ..................... 331/47, 50, 51, 53, 331/55, 2, 10, 25

[56] References Cited

U.S. PATENT DOCUMENTS

| 3,304,518 | 2/1967 | Mackey | 331/55 |
| 4,259,744 | 3/1981 | Junod et al. | 331/2 |
| 4,318,055 | 3/1982 | Hopwood et al. | 331/25 |
| 4,347,484 | 8/1982 | Vandegraaf | 331/25 |
| 4,357,580 | 11/1982 | Mawhinney | 331/51 |

Primary Examiner—John S. Heyman
Attorney, Agent, or Firm—John T. O'Halloran; Alfred C. Hill

[57] ABSTRACT

The broadband injection locked oscillator system comprises a first voltage controlled oscillator having a signal output for a first signal controlled to have a first frequency in a first relatively broad frequency range, and a second voltage controlled oscillator having a signal output for a second signal controlled to have a second frequency in a second relatively broad frequency band. The output of the second oscillator is coupled to a signal input of the first oscillator to injection lock the first oscillator to the second oscillator. The second frequency is harmonically related to the first frequency when the injection lock occurs.

23 Claims, 3 Drawing Figures

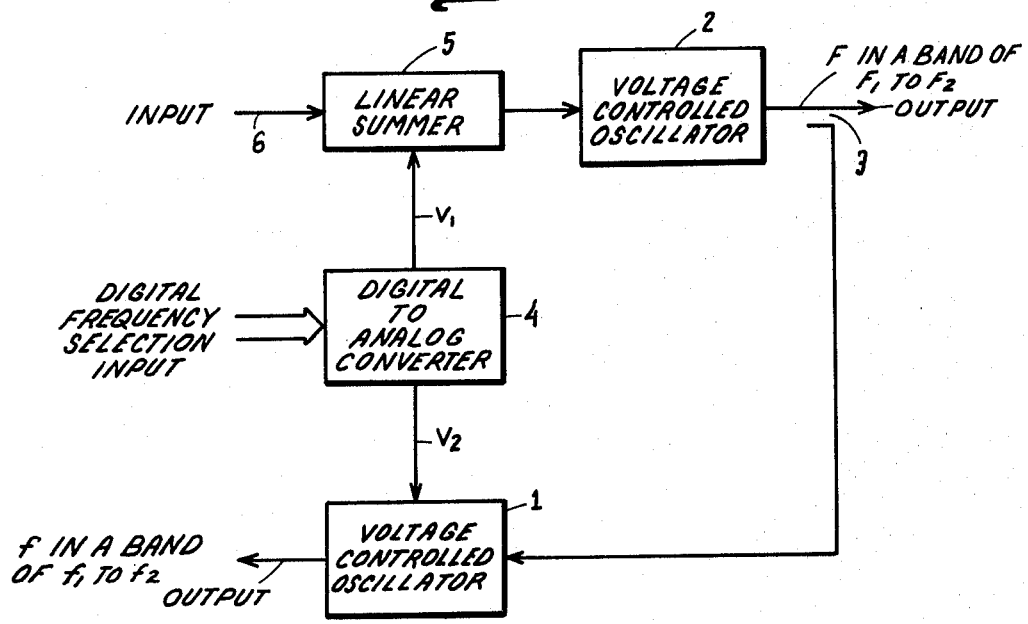
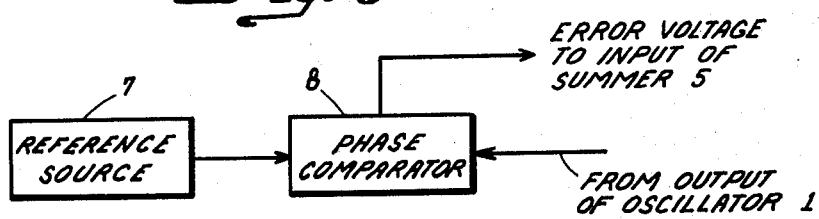
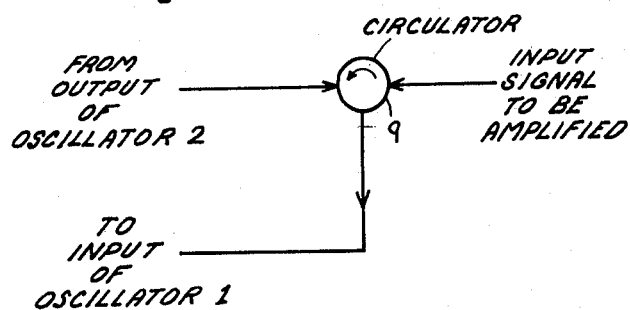

BROADBAND INJECTION LOCKED OSCILLATOR SYSTEM

BACKGROUND OF THE INVENTION

The present invention relates to locked oscillators and more particularly to injection locked oscillators.

Injection locking of oscillators is a well known phenomenon where the oscillating frequency of one oscillator is locked to the oscillating frequency of another oscillator such that the output of the injection locked oscillator has a frequency harmonically related to the frequency of the oscillator to which it is locked.

The basic technique of injection locked oscillators using fixed frequency oscillators has been used at high microwave frequencies to realize functions such as signal amplification, frequency division, frequency multiplication, synchronization of two oscillators and providing a clean signal from an oscillator injection locked by a noisy oscillator. The injection locked fixed frequency oscillators of the prior art, however, suffer from a relatively narrow frequency range of reliable operation. This is due to the inherently narrow frequency range of fixed oscillators.

SUMMARY OF THE INVENTION

An object of the present invention is to provide an injection locked oscillator system having a relatively broad frequency range for reliable operation.

Another object of the present invention is to employ voltage controlled oscillators in an injection locked oscillator system instead of fixed frequency oscillators to thereby provide a relatively broadband of reliable operation at high microwave frequencies.

A feature of the present invention is the provision of a broadband injection locked oscillator system comprising a first voltage controlled oscillator having a signal output for a first signal controlled to have a first frequency in a first relatively broad frequency range; and a second voltage controlled oscillator having a signal output for a second signal controlled to have a second frequency in a second relatively broad frequency range, the output of the second oscillator being coupled to a signal input of the first oscillator to injection lock the first oscillator to the second oscillator, the second frequency being harmonically related to the first frequency when the injection lock occurs.

BRIEF DESCRIPTION OF THE DRAWING

Above-mentioned and other features and objects of this invention will become more apparent by reference to the following description taken in conjunction with the accompanying drawing, in which:

FIG. 1 is a block diagram illustrating a broadband injection locked oscillator system in accordance with the principles of the present invention;

FIG. 2 is a block diagram of a modification of the oscillator system of FIG. 1 enabling amplification of an input signal; and FIG. 3 is a block diagram showing the basic components of a phase locked loop which may incorporate the injection locked oscillator system of FIG. 1.

DESCRIPTION OF THE PREFERRED EMBODIMENTS

Referring to FIG. 1, the broadband injection locked oscillator system of the present invention includes a voltage controlled oscillator 1 which has its frequency of operation locked to the frequency or harmonic of the frequency of voltage controlled oscillator 2. The output from oscillator 2 is coupled to the control input of oscillator 1 by means of a coupler 3. The frequency of oscillator 2 is controlled by voltage $V_1$ coupled thereto from a digital-to-analog converter 4 directly or through a linear summer 5. The value of $V_1$ is determined by a digital input to converter 4 which selects the frequency of oscillator 2. Oscillator 1 has its frequency coursely set by a voltage $V_2$ also derived from converter 4. By means of different digital inputs to converter 4 the frequency of operation of oscillators 1 and 2 can be selected in a relatively broad frequency range in the high microwave frequency band since the frequency band of operation of oscillators 1 and 2 is not limited by the limited frequency range for reliable operation of fixed frequency oscillators.

The system of FIG. 1 can be modified to provide amplification of an input signal as shown in FIG. 2 by replacing coupler 3 with a circulator 9. The signal to be amplified is coupled to circulator 9 together with the output signal of oscillator 2. Oscillator 1 is constructed to be a high power oscillator and is injection locked by the output signal of oscillator 2 coupled to oscillator 1 through circulator 9 as described hereinabove with respect to FIG. 1. The signal to be amplified is also coupled to oscillator 1 via circulator 9 and the resultant high power output of oscillator 1 is an amplified version of the signal to be amplified.

The system of FIG. 1 can also be employed as a frequency divider by having the output frequency F of oscillator 2 controlled to be N times greater than the frequency f of the output signal from oscillator 1. N would be the division factor which would be an integer, thereby resulting in a frequency division $f=F/N$.

The above described arrangement for providing frequency division in the system of FIG. 1 can be employed in a phase lock loop which basically includes besides the system of FIG. 1 a reference source 7 and a phase comparator 8 as shown in FIG. 3. The output f from oscillator 1 would be coupled to one input of phase comparator 8, the output of reference source 7 would be coupled to the other input of phase comparator 8 and an error between these two inputs would produce an error voltage at the output of phase comparator which is coupled to input 6 of summer 5.

The arrangement of FIG. 1 can be also employed as a frequency multiplier by constructing oscillator 2 to provide an output frequency F which is N times smaller than the output frequency f of oscillator 1. Thus, the output frequency f would be equal to NF resulting in a frequency multiplication of the frequency F at the output of oscillator 1.

Another arrangement in which the system of FIG. 1 can be employed is an arrangement where oscillator 2 is constructed as a low spectral quality or noisy oscillator, such as a Gunn or avalanche oscillator, and voltage controlled oscillator 1 is constructed as a higher spectral quality oscillator, such as a high Q bipolar transistor oscillator. When oscillator 1 is injection locked by oscillator 2, the resultant output of oscillator 1 would be a cleaned-up version or a higher spectral quality output of the output signal from oscillator 2.

As can be seen, the system of FIG. 1 can provide a broadband injection locked oscillator system which can provide signal amplification, frequency division, frequency multiplication, oscillator synchronization, and signal noise reduction or clean-up which results in reduced complexity and cost as compared to the prior art arrangements which would require several fixed frequency oscillator configurations to cover the broadband covered by the present invention.

The system of FIG. 1 can have two modes of operation when injection lock between oscillators 1 and 2 occur, namely, when the two frequencies f and F are harmonically related, for example, f=NF. In one mode the applied voltages $V_1$ and $V_2$ track so that N is kept constant, or the applied voltage $V_2$ to oscillator 1 varies so that the effective N varies and f is kept constant.

While I have described above the principles of my invention in connection with specific apparatus, it is to be clearly understood that this description is made only by way of example and not as a limitation to the scope of my invention as set forth in the objects thereof and in the accompanying claims.

I claim:

1. A broadband injection locked oscillator system comprising:
   a first voltage controlled oscillator having a signal output for a first signal controlled by a first voltage to have a first frequency in a first relatively broad frequency range; and
   a second voltage controlled oscillator having a signal output for a second signal controlled by a second voltage different than said first voltage to have a second frequency in a second relatively broad frequency range, said output of said second oscillator being coupled to a signal input of said first oscillator to injection lock said first oscillator to said second oscillator, said second frequency being harmonically related to said first frequency when said injection lock occurs.

2. A system according to claim 1, further including a digital-to-analog converter having a digital frequency selection input, a first voltage output for said first voltage coupled to a control input of said first oscillator and a second voltage output for said second voltage coupled to a control input of said second oscillator.

3. A system according to claim 2, further including a linear summer having a first input, a second input coupled to said second voltage output and an output coupled to said control input of said second oscillator.

4. A system according to claims 1, 2 or 3, wherein said first and second frequencies and said first and second frequency ranges are in a high microwave frequency band.

5. A system according to claim 3, wherein the output of said second oscillator is coupled to a first input of a circulator having an output coupled to an input of said first oscillator and a signal to be amplified is coupled to a second input of said circulator, and
   said first oscillator is a high-power oscillator to provide at its output an amplified version of said signal to be amplified.

6. A system according to claim 3, wherein said second frequency is N times greater than said first frequency resulting in a frequency division of said second frequency, where N is an integer greater than one.

7. A system according to claim 6, wherein said output of said first oscillator is coupled to a phase comparator of a phase locked loop and said first input of said summer is coupled to an error signal output of said phase comparator.

8. A system according to claim 3, wherein said first frequency is N times greater than said second frequency resulting in a frequency multiplication of said second frequency, where N is an integer greater than one.

9. A system according to claim 3, wherein said second oscillator includes an oscillator circuit having low spectral quality and said first oscillator includes an oscillator circuit having relatively high spectral quality resulting in said first signal having said relatively high spectral quality.

10. A system according to claim 3, wherein said output of said first oscillator is coupled to a phase comparator of a phase locked loop and said first input of said summer is coupled to an error signal output of said phase comparator.

11. A system according to claims 5, 6, 7, 8, 9 or 10, wherein said first and second frequencies and said first and second frequency ranges are in a high microwave frequency band.

12. A system according to claim 1, further including a linear summer having a first input, a second input coupled to said second voltage and an output coupled to a control input of said second oscillator.

13. A system according to claim 12, wherein the output of said second oscillator is coupled to a first input of a circulator having an output coupled to an input of said first oscillator and a signal to be amplified is coupled to a second input of said circulator, and
    said first oscillator is a high-power oscillator to provide at its output an amplified version of said signal to be amplified.

14. A system according to claim 12, wherein said second frequency is N times greater than said first frequency resulting in a frequency division of said second frequency, where N is an integer greater than one.

15. A system according to claim 14, wherein said output of said first oscillator is coupled to a phase comparator of a phase locked loop and said first input of said summer is coupled to an error signal output of said phase comparator.

16. A system according to claim 12, wherein said output of said first oscillator is coupled to a phase comparator of a phase locked loop and said first input of said summer is coupled to an error signal output of said phase comparator.

17. A system according to claim 12, wherein said first frequency is N times greater than said second frequency resulting in a frequency multiplication of said second frequency, where N is an integer greater than one.

18. A system according to claim 12, wherein said second oscillator includes an oscillator circuit having low spectral quality and said first oscillator includes an oscillator circuit having relatively high spectral quality resulting in said first signal having said relatively high spectral quality.

19. A system according to claims 12, 13, 14, 15, 16, 17 or 18, wherein said first and second frequencies and said first and second frequency ranges are in a high microwave frequency band.

20. A system according to claim 1, wherein said second frequency is N times greater than said first frequency resulting in a frequency division of said second frequency, where N is an integer greater than one.

21. A system according to claim 1, wherein said first frequency is N times greater than said second frequency resulting in a frequency multiplication of said second frequency, where N is an integer greater than one.

22. A system according to claim 1, wherein said second oscillator includes an oscillator circuit having low spectral quality and said first oscillator includes an oscillator circuit having relatively high spectral quality resulting in said first signal having said relatively high spectral quality.

23. A system according to claims 20, 21 or 22, wherein
said first and second frequencies and said first and second frequency ranges are in a high microwave frequency band.

* * * * *